United States Patent
Trinh

(10) Patent No.: US 11,309,492 B2
(45) Date of Patent: *Apr. 19, 2022

(54) MULTI-LAYER STRUCTURE TO INCREASE CRYSTALLINE TEMPERATURE OF A SELECTOR DEVICE

(71) Applicant: Taiwan Semiconductor Manufacturing Co., Ltd., Hsin-Chu (TW)

(72) Inventor: Hai-Dang Trinh, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/081,138

(22) Filed: Oct. 27, 2020

(65) Prior Publication Data
US 2021/0043835 A1  Feb. 11, 2021

Related U.S. Application Data

(63) Continuation of application No. 16/587,617, filed on Sep. 30, 2019, now Pat. No. 10,847,718, which is a (Continued)

(51) Int. Cl.
H01L 45/00 (2006.01)
H01L 27/24 (2006.01)

(52) U.S. Cl.
CPC ...... *H01L 45/1233* (2013.01); *H01L 27/2481* (2013.01); *H01L 45/06* (2013.01); (Continued)

(58) Field of Classification Search
CPC ............... H01L 45/1233; H01L 45/141; H01L 27/2481; H01L 45/1675; H01L 45/06; H01L 45/1608
See application file for complete search history.

(56) References Cited

U.S. PATENT DOCUMENTS 8,110,476 B2  2/2012 Scheuerlein et al.
9,761,635 B1  9/2017 Jo
(Continued)

OTHER PUBLICATIONS

Govoreanu, et al. "Selectors for High Density Crosspoint Memory Arrays: Design Considerations, Device Implementations and Some Challenges Ahead." IEEE 2015 International Conference on IC Design & Technology (ICICDT). Published Jul. 27, 2015.
Velea, et al. "Te-Based Chalcogenide Materials for Selector Applications." Scientific Reports | 7: 8103 | DOI:10.1038/s41598-017-08251-z. Published Aug. 14, 2017.
(Continued)

*Primary Examiner* — Karen Kusumakar
(74) *Attorney, Agent, or Firm* — Eschweiler & Potashnik, LLC

(57) ABSTRACT

In some embodiments, a semiconductor device is provided. The semiconductor device includes a first amorphous switching structure disposed over a first electrode. A buffer structure is disposed over the first amorphous switching structure. A second amorphous switching structure is disposed over the buffer structure. A second electrode is disposed over the second amorphous switching structure, where the first and second amorphous switching structures are configured to switch between low resistance states and high resistance states depending on whether a voltage from the first electrode to the second electrode exceeds a threshold voltage.

20 Claims, 9 Drawing Sheets

Related U.S. Application Data continuation of application No. 16/025,008, filed on Jul. 2, 2018, now Pat. No. 10,497,867.

(52) U.S. Cl.
CPC ........ *H01L 45/141* (2013.01); *H01L 45/1608* (2013.01); *H01L 45/1675* (2013.01)

(56) References Cited

U.S. PATENT DOCUMENTS

| | | |
|---|---|---|
| 10,153,327 B1 | 12/2018 | Park |
| 2004/0042259 A1 | 3/2004 | Campbell et al. |
| 2006/0097341 A1 | 5/2006 | Pellizzer et al. |
| 2010/0059730 A1 | 3/2010 | Ito et al. |
| 2018/0040669 A1* | 2/2018 | Wu ...................... H01L 45/148 |

OTHER PUBLICATIONS

Raoux, et al. "Crystallization Properties of Ultrathin Phase Change Films." Journal of Applied Physics 103, 114310 (2008).

Chen, An. "Analysis of Partial Bias Schemes for the Writing of Crossbar Memory Arrays." IEEE Transactions on Electron Devices, vol. 62, No. 9, Sep. 2015.

Non-Final Office Action dated May 1, 2019 for U.S. Appl. No. 16/025,008.

Notice of Allowance dated Aug. 2, 2019 for U.S. Appl. No. 16/025,008.

Non-Final Office Action dated Apr. 1, 2020 for U.S. Appl. No. 16/587,617.

Notice of Allowance dated Jul. 16, 2020 for U.S. Appl. No. 16/587,617.

* cited by examiner

US 11,309,492 B2

MULTI-LAYER STRUCTURE TO INCREASE CRYSTALLINE TEMPERATURE OF A SELECTOR DEVICE

REFERENCE TO RELATED APPLICATION

This Application is a Continuation of U.S. application Ser. No. 16/587,617, filed on Sep. 30, 2019, which is a Continuation of U.S. application Ser. No. 16/025,008, filed on Jul. 2, 2018 (now U.S. Pat. No. 10,497,867, issued on Dec. 3, 2019). The contents of the above-referenced Patent Applications are hereby incorporated by reference in their entirety.

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include resistive random-access memory (RRAM), phase-change random-access memory (PCRAM), magnetoresistive random-access memory (MRAM), and conductive-bridging random-access memory (CBRAM). In some next generation electronic memory, selector devices are coupled to memory cells to mitigate the negative effects (e.g., sneak paths) associated with scaling down the feature size of next generation electronic memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
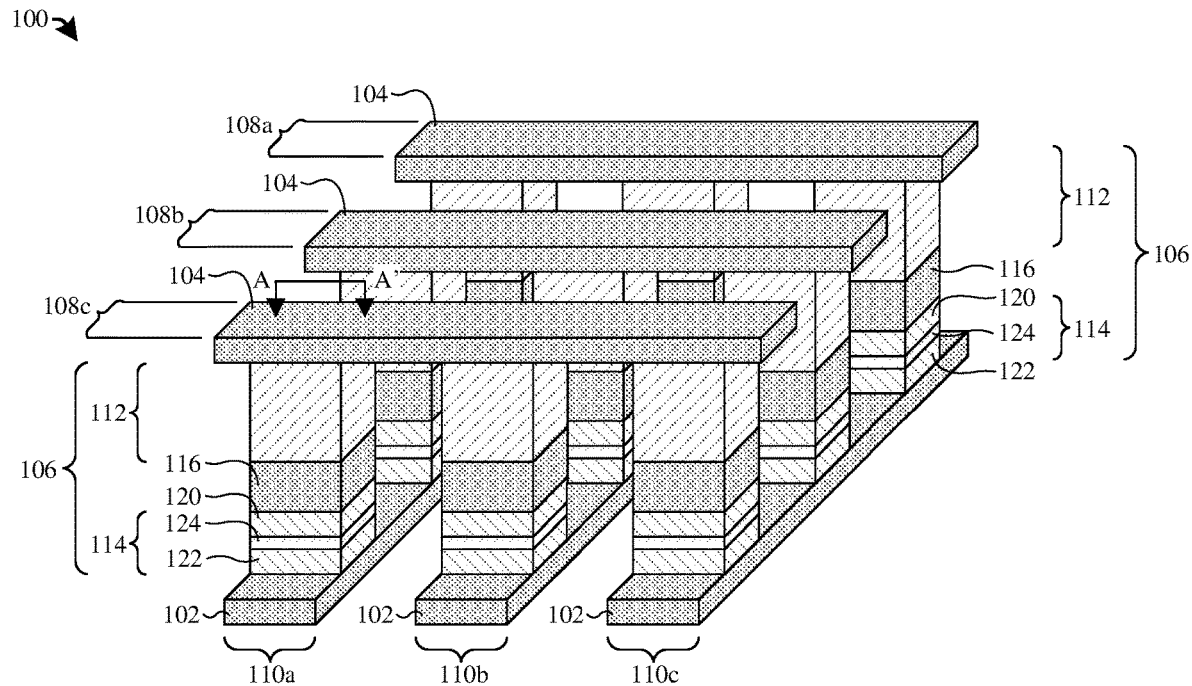
FIGS. 1A-1B illustrate various views of some embodiments of a memory device having a plurality of semiconductor devices each having a buffer structure disposed between a first amorphous switching structure and a second amorphous switching structure.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some next generation memory comprises a plurality of resistive switching cells. The resistive switching cells define a memory array and are arranged in a plurality of rows and a plurality of columns (e.g., in a cross-bar array). A plurality of first conductive lines are disposed beneath the memory array, and a plurality of second conductive lines are disposed over the memory array. The first conductive lines each extend along an individual column in the memory array and are each coupled to the resistive switching cells in the individual column. The second conductive lines each extend along an individual row in the memory array and are each coupled to the resistive switching elements in the individual row. To select an individual resistive switching cell (e.g., to read/write/erase the cell), a first bias is applied to a first conductive line coupled to the individual resistive switching cell, while a second bias is applied to a second conductive line coupled to the individual resistive switching cell. To improve the sensing margin (e.g., the difference in current between read state "1" and read state "0"), partial biasing schemes (e.g., ½ bias and ⅓ bias schemes) are utilized by applying a partial bias to unselected first conductive lines and unselected second conductive lines.

One challenge with next generation memory is the unintentional activation of unselected resistive switching cells. Due to sneak current and/or the partial biasing of unselected cells, an unselected cell may be exposed to a bias that is sufficient to activate the unselected cell. Accordingly, to prevent the unintentional selection of unselected devices, select devices may be coupled to resistive switching cells (e.g., to obtain a more nonlinear I-V characteristic of the resistive switching cell). In various instances, the select devices comprise an ovonic threshold switching (OTS) layer. The OTS layer is formed in an amorphous state and is configured to switch between a high resistance state and a low resistance state depending on whether a bias applied across the select device exceeds a threshold bias.

One challenge with utilizing an OTS layer in a select device is integrating the formation of the OTS layer in typical back-end-of-line (BEOL) fabrication. During BEOL fabrication, an interconnect structure comprising the select devices may be formed over a semiconductor substrate. To form the interconnect structure, the semiconductor substrate is exposed to a relatively high BEOL fabrication temperature (e.g., about 300° C. or about 400° C.). However, the BEOL fabrication temperature may be greater than the crystallization temperature of the OTS layer (e.g., the temperature at which the OTS layer crystallizes). If the OTS layer crystallizes, the OTS layer may be formed having a low resistance state and the select device may not prevent unintentional activation of unselected cells.

Various embodiments of the present disclosure are directed toward a semiconductor device having a buffer structure disposed between a first amorphous switching structure and a second amorphous switching structure to increase the crystallization temperature of the first and second amorphous switching structures. In various embodiments, a first amorphous switching structure is arranged over a first electrode. A buffer structure is arranged over the first amorphous switching structure. A second amorphous switching structure is arranged over the buffer structure. A second electrode is arranged over the second amorphous switching structure. The first and second amorphous switching structures are configured to switch between low resistance states and high resistance states depending on whether a voltage from the first electrode to the second electrode exceeds a threshold voltage.

The buffer structure reduces the individual thicknesses of the first amorphous switching structure and the second amorphous switching structure. By reducing the individual thicknesses, respective crystallization temperatures of the first amorphous switching structure and the second amorphous switching structure are increased. Thus, the first amorphous switching structure and the second amorphous switching structure may have a crystallization temperature that is greater than the BEOL fabrication temperature. Accordingly, the first amorphous switching structure and the second amorphous switching structure may be integrated into an interconnect structure formed during BEOL fabrication.

Figure 1B:
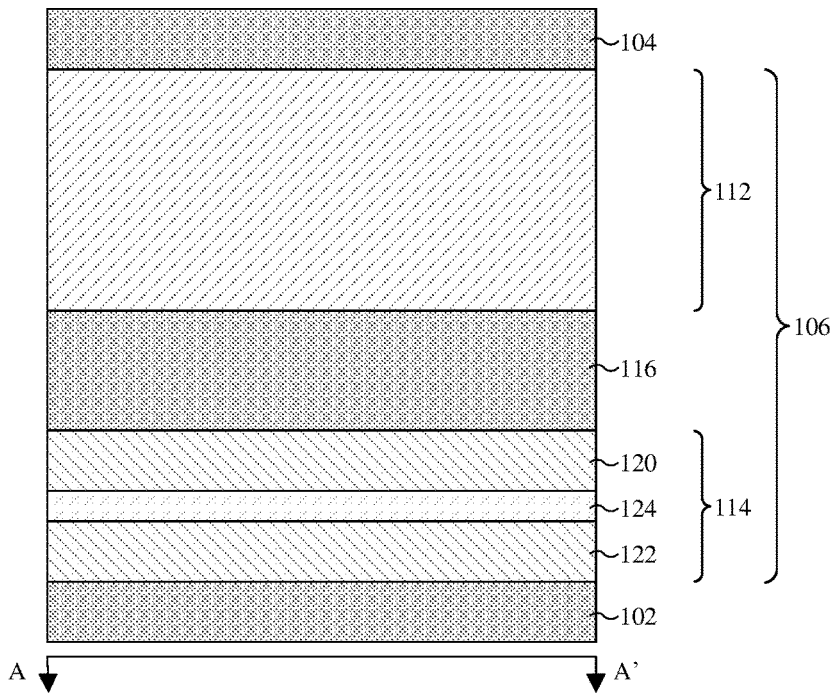

FIGS. 1A-1B illustrate various views of some embodiments of a memory device 100 having a plurality of semiconductor devices each having a buffer structure disposed between a first amorphous switching structure and a second amorphous switching structure. FIG. 1A illustrates a perspective view of some embodiments of the memory device 100. FIG. 1B illustrates a cross-sectional view of some embodiments of a region of the memory device 100 taken alone line A-A' of FIG. 1A.

The memory device 100 comprises a plurality of first conductive lines 102. The first conductive lines 102 each extend laterally in a first direction. In various embodiments, the first conductive lines 102 are arranged in parallel with one another. In some embodiments, the plurality of first conductive lines 102 may comprise, for example, copper, aluminum, tungsten, some other suitable conductor, or a combination of the foregoing.

A plurality of second conductive lines 104 are arranged over the plurality of first conductive lines 102. The second conductive lines 104 each extend laterally in a second direction transverse the first direction. In various embodiments, the second conductive lines 104 are arranged in parallel with one another. In some embodiments, the plurality of second conductive lines 104 may comprise, for example, copper, aluminum, tungsten, some other suitable conductor, or a combination of the foregoing.

A plurality of one selector-one memory cell (1S1MC) stacks 106 are disposed between the plurality of first conductive lines 102 and the plurality of second conductive lines 104. In various embodiments, the 1S1MC stacks 106 are arranged in an array having a plurality of rows 108a-c and a plurality of columns 110a-c. In some embodiments, an individual first conductive line 102 and an individual second conductive line 104 are coupled to each individual 1S1MC stack 106. In further embodiments, respective first conductive lines 102 are coupled to respective columns 110a-110c of 1S1MC stacks 106. In yet further embodiments, respective second conductive lines 104 are coupled to respective rows 108a-108c of 1S1MC stacks 106.

Each 1S1MC stack 106 comprises a memory cell 112 separated from a threshold selector 114 by an electrode 116. In various embodiments, the electrode 116 is a common electrode directly contacting the memory cell 112 and the threshold selector 114. In some embodiments, the electrode 116 may comprise, for example, doped polysilicon, copper, aluminum, tungsten, some other suitable conductor, or a combination of the foregoing.

The memory cell 112 is configured to store data and may be a non-volatile memory cell or a volatile memory cell. In some embodiments, the memory cell 112 may be a resistive switching memory cell (e.g., resistive random-access memory (RRAM) cell, phase-change random-access memory (PCRAM) cell, conductive-bridging random-access memory (CBRAM) cell, etc.) configured to store data based on a resistive state of a data storage structure. For example, the data storage structure may have a high resistance state associated with a first data state (e.g., binary "0") or a low resistance state associated with a second data state (e.g., binary "1"). In some embodiments, the data storage structure may comprise, for example, a chalcogenide, an oxide, a nitride, a high-k dielectric, or some other suitable dielectric. In further embodiments, the memory cell may be a magnetoresistive random-access memory (MRAM) cell. In such an embodiment, the data storage structure may comprise a magnetic tunnel junction (MTJ) configured to store data based on a magnetic orientation of the MTJ.

The threshold selector 114 comprises a first amorphous switching structure 120 separated from a second amorphous switching structure 122 by a first buffer structure 124. The threshold selector 114 is configured to switch between a low resistance state and a high resistance state depending on whether a voltage applied across the threshold selector 114 is greater than a threshold voltage. For example, the threshold selector 114 may have a high resistance state if a voltage across the threshold selector 114 is less than the threshold voltage, and the threshold selector 114 may have a low resistance state if a voltage across the threshold selector 114 is greater than the threshold voltage.

In various embodiments, the first buffer structure 124 contacts both the first amorphous switching structure 120 and the second amorphous switching structure 122. In some embodiments, the first buffer structure 124 may comprise an amorphous solid. In further embodiments, the first buffer structure 124 may comprise, for example, amorphous silicon (a-Si), amorphous germanium (a-Ge), amorphous silicon germanium (a-SiGe), an amorphous carbon nitride compound (a-CNx), amorphous carbon (a-C), boron-doped carbon, a silicon oxide compound (SiOx), or an aluminum oxide compound (AlOx). In yet further embodiments, the first buffer structure 124 may not comprise a chalcogenide (e.g., generally a chemical compound comprising a Group 16 element other than oxygen). In some embodiments, the first buffer structure 124 may have a thickness between about 0.5 nanometer (nm) and about 5 nm. In further embodiments, if the first buffer structure 124 comprises an insulator, the first buffer structure 124 may have a thickness less than about 1 nm, such that the first buffer structure 124 does not negatively affect the electrical properties (e.g., current) of the threshold selector 114.

The first amorphous switching structure 120 and the second amorphous switching structure 122 are configured to switch between low resistance states and high resistance states depending on whether a voltage applied across the threshold selector 114 exceeds a threshold voltage. For example, the first amorphous switching structure 120 may have a high resistance state if a voltage across the first amorphous switching structure 120 is less than the threshold voltage, and the first amorphous switching structure 120 may have a low resistance state if a voltage across the first amorphous switching structure 120 is greater than the threshold voltage. In various embodiments, the first amorphous switching structure 120 may contact the first buffer structure 124 and the electrode 116. In some embodiments, the second amorphous switching structure 122 may contact the first buffer structure 124 and an individual first conductive line 102. In further embodiments, the first amorphous switching structure 120 and the second amorphous switching structure 122 comprise a chalcogenide (e.g., generally a chemical compound comprising a Group 16 element other than oxygen). In yet further embodiments, the first amorphous switching structure 120 and the second amorphous switching structure 122 may comprise, for example, tellurium (Te), selenium (Se), sulfur (S), polonium (Po), in combination with, for example, germanium (Ge), silicon (Si), gallium (Ga), indium (In), phosphorus (P), boron (B), carbon (C), nitrogen (N), oxygen (O), etc.

In some embodiments, the first amorphous switching structure 120 and the second amorphous switching structure 122 may have a thickness between about 2 nm and about 10 nm. The ability of the threshold selector 114 to prevent leakage current in its high resistance state and the threshold voltage of the threshold selector 114 are related to an overall thickness of the first amorphous switching structure 120 and the second amorphous switching structure 122 (e.g., a combined thickness of the first amorphous switching structure 120 and the second amorphous switching structure 122). For example, if the overall thickness is less than a minimum thickness (e.g., about 10 nm), leakage current may be high. On the other hand, if the overall thickness exceeds a maximum thickness (e.g., about 30 nm), the threshold voltage may be too high (e.g., outside a range of operating voltages in a typical integrated chip (IC)).

Further, the crystallization temperature of the first amorphous switching structure 120 and the second amorphous switching structure 122 is related to their respective thicknesses. For example, as a thickness of the first amorphous switching structure 120 or the second amorphous switching structure 122 increases, their respective crystallization temperatures decrease. In some embodiments, the crystallization temperature of the first amorphous switching structure 120 and the second amorphous switching structure 122 is great than about 300° C. In further embodiments, the crystallization temperature of the first amorphous switching structure 120 and the second amorphous switching structure 122 is great than about 400° C.

As discussed above, a threshold selector typically has a single amorphous switching structure. For the threshold selector to prevent leakage current in its high resistance state, the amorphous switching structure generally has a thickness that causes the crystallization temperature of the amorphous switching structure to be less than a back-end-of-line (BEOL) fabrication temperature (e.g., about 300° C. or about 400° C.). Because the crystallization temperature is below the BEOL fabrication temperature, the amorphous switching structure may crystallize. If the amorphous switching structure crystallizes during BEOL fabrication, the amorphous switching structure may be formed having a low resistance state and the threshold selector may not prevent leakage current. Thus, the threshold selector may not prevent unintentional activation of unselected cells.

By inserting the first buffer structure 124 between the first amorphous switching structure 120 and the second amorphous switching structure 122, the respective thicknesses of the first amorphous switching structure 120 and the second amorphous switching structure 122 may effectively be reduced. Therefore, the overall thickness of the first amorphous switching structure 120 and the second amorphous switching structure 122 may be increased (e.g., to prevent leakage current) without decreasing the crystallization temperatures of the first amorphous switching structure 120 and the second amorphous switching structure 122. Thus, the first amorphous switching structure 120 and the second amorphous switching structure 122 may have a crystallization temperature greater than the BEOL fabrication temperature. Because the first amorphous switching structure 120 and the second amorphous switching structure 122 may have a crystallization temperature greater than the BEOL fabrication temperature, the first amorphous switching structure 120 or the second amorphous switching structure 122 may not crystalize during BEOL fabrication. Accordingly, the threshold selector 114 may be formed during BEOL fabrication while ensuring the threshold selector 114 have desirable electrical properties (e.g., prevent leakage current and/or have a functional threshold voltage).

Figure 2A:
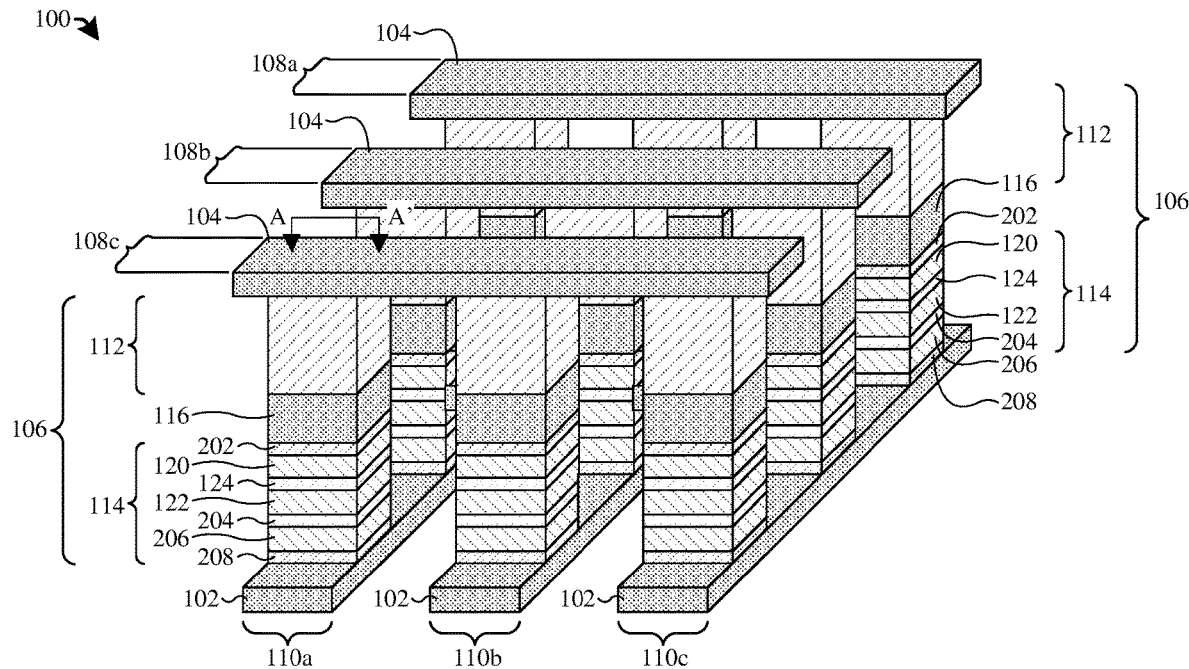
FIGS. 2A-2B illustrate various views of some alternative embodiments of the memory device of FIG. 1 in which the threshold selector has additional buffer structures and an additional amorphous switching structure.
Figure 2B:
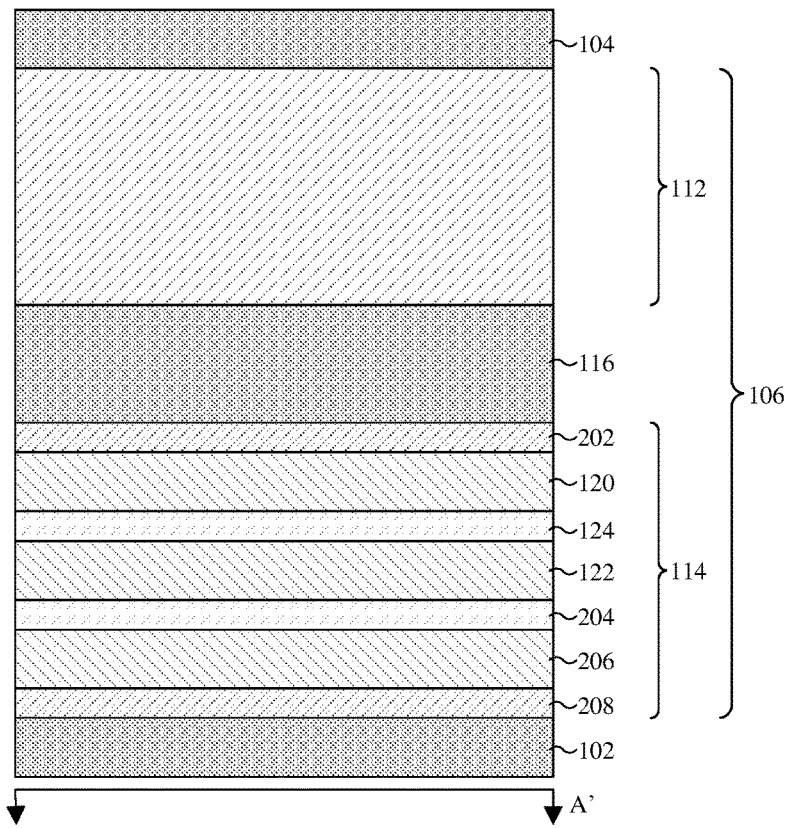

FIGS. 2A-2B illustrate various views of some alternative embodiments of the memory device 100 of FIG. 1 in which the threshold selector 114 has additional buffer structures and an additional amorphous switching structure. FIG. 2A illustrates a perspective view of some embodiments of the memory device 100. FIG. 2B illustrates a cross-sectional view of some embodiments of a region of the memory device 100 taken alone line A-A' of FIG. 2A.

As shown in FIGS. 2A-2B, a second buffer structure 202 is disposed between the first amorphous switching structure 120 and the electrode 116. In various embodiments, the second buffer structure 202 directly contacts both the first amorphous switching structure 120 and the electrode 116. In some embodiments, the second buffer structure 202 comprises the same material as the first buffer structure 124. In other embodiments, the second buffer structure 202 comprises a different material than the first buffer structure 124. In further embodiments, the second buffer structure 202 may comprise an amorphous solid. In yet further embodiments, the second buffer structure 202 is configured to minimize nucleation sites for the first amorphous switching structure 120 due to the electrode 116 being a crystalline metal, which may act as a crystalline promoter for the first amorphous switching structure 120 during subsequent thermal process(es).

A third buffer structure 204 is disposed between the second amorphous switching structure 122 and a third amorphous switching structure 206. In various embodiments, the third buffer structure 204 directly contacts both the second amorphous switching structure 122 and the third amorphous switching structure 206. In some embodiments, the third buffer structure 204 comprises the same material as the first buffer structure 124. In other embodiments, the second buffer structure 202 comprises a different material than the first buffer structure 124. In further embodiments, the third buffer structure 204 may comprise an amorphous solid.

In various embodiments, the third amorphous switching structure 206 is disposed between the third buffer structure 204 and a fourth buffer structure 208. The third amorphous switching structure 206 is configured to switch between a low resistance state and a high resistance state depending on whether a voltage applied across the threshold selector 114 exceeds a threshold voltage. In various embodiments, the third amorphous switching structure 206 may directly contact the third buffer structure 204 and the fourth buffer structure 208. In various embodiments, the third amorphous switching structure 206 may comprise the same material as the first amorphous switching structure 120 and/or the second amorphous switching structure 122. In some embodiments, the third amorphous switching structure 206 may comprise a different material than the first amorphous switching structure 120 and/or the second amorphous switching structure 122. In further embodiments, a crystallization temperature of the third amorphous switching structure 206 is great than about 300° C. In further embodiments, the crystallization temperature of the third amorphous switching structure 206 is great than about 400° C.

In various embodiments, the fourth buffer structure 208 is disposed between the third amorphous switching structure 206 and an individual first conductive line 102. In various embodiments, the fourth buffer structure 208 directly contacts both the third amorphous switching structure 206 and the individual first conductive line 102. In some embodiments, the fourth buffer structure 208 comprises the same material as the second buffer structure 202. In other embodiments, the fourth buffer structure 208 comprises a different material than the second buffer structure 202. In further embodiments, the fourth buffer structure 208 may comprise an amorphous solid. In yet further embodiments, the fourth buffer structure 208 is configured to minimize nucleation sites for the third amorphous switching structure 206 due to the individual first conductive line 102 being a crystalline metal, which may act as a crystalline promoter for the third amorphous switching structure 206 during subsequent thermal process(es).

In various embodiments, the second buffer structure 202, the third buffer structure 204, and the fourth buffer structure 208 may comprise, for example, amorphous silicon (a-Si), amorphous germanium (a-Ge), amorphous silicon germanium (a-SiGe), an amorphous carbon nitride compound (a-CNx), amorphous carbon (a-C), boron-doped carbon, a silicon oxide compound (SiOx), an aluminum oxide compound (AlOx). In yet further embodiments, the second buffer structure 202, the third buffer structure 204, and the fourth buffer structure 208 may not comprise a chalcogenide (e.g., generally a chemical compound comprising a Group 16 element other than oxygen).

In some embodiments, the second buffer structure 202, the third buffer structure 204, and the fourth buffer structure 208 may have respective thicknesses between about 0.5 nanometer (nm) and about 5 nm. In various embodiments, the first buffer structure, 124, the second buffer structure 202, the third buffer structure 204, and the fourth buffer structure 208 may have respective thicknesses that are substantially the same. In further embodiments, the first buffer structure 124 and the third buffer structure 204 may have respective thicknesses that are substantially the same, while the second buffer structure 202 and the fourth buffer structure 208 have respective thicknesses that are substantially the same but different than the respective thicknesses of the first buffer structure 124 and the third buffer structure 204. In yet further embodiments, if the second buffer structure 202, the third buffer structure 204, or the fourth buffer structure 208 comprise an insulator, their respective thicknesses may be less than about 1 nm, such that the electrical properties (e.g., current) of the threshold selector is not adversely affected.

In various embodiments, the third amorphous switching structure 206 comprises a chalcogenide (e.g., generally a chemical compound comprising a Group 16 element other than oxygen). In some embodiments, the third amorphous switching structure may comprise, for example, tellurium (Te), selenium (Se), sulfur (S), polonium (Po), in combination with, for example, germanium (Ge), silicon (Si), gallium (Ga), indium (In), phosphorus (P), boron (B), carbon (C), nitrogen (N), oxygen (O), etc. In further embodiments, the third amorphous switching structure 206 may have a thickness between about 2 nm and about 10 nm. In yet further embodiments, the first amorphous switching structure 120, the second amorphous switching structure 122, and the third amorphous switching structure 206 have respective thicknesses that are substantially the same.

Figure 3:
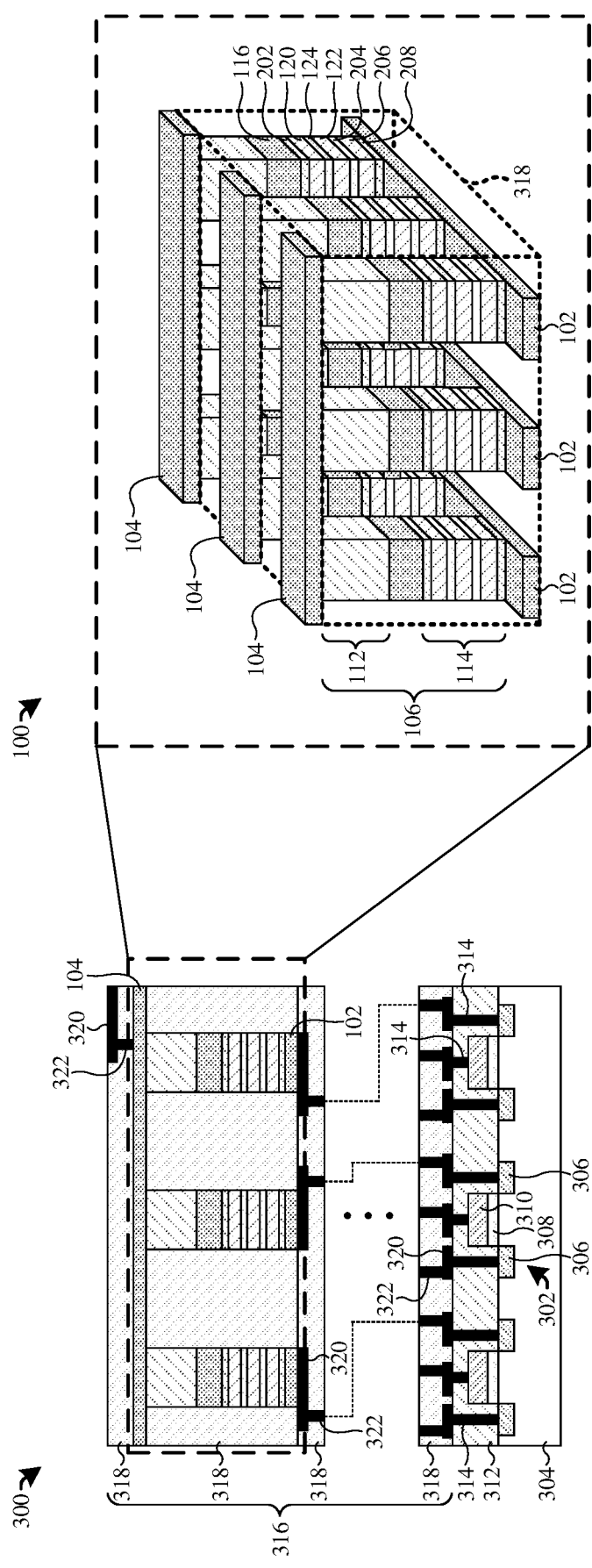
FIG. 3 illustrates a cross-sectional view of some embodiments of an integrated chip (IC) comprising a memory device having a plurality of semiconductor devices each having a plurality of buffer structures and a plurality of amorphous switching structures.

FIG. 3 illustrates a cross-sectional view of some embodiments of an integrated chip (IC) 300 comprising a memory device 100 having a plurality of semiconductor devices each having a plurality of buffer structures and a plurality of amorphous switching structures.

The IC 300 comprises a metal-oxide-semiconductor filed-effect transistor (MOSFET) 302 disposed on a semiconductor substrate 304. The MOSFET 302 comprises a pair of source/drain regions 306 disposed in the semiconductor substrate 304 and laterally spaced. A gate dielectric 308 is disposed over the semiconductor substrate 304 between the individual source/drain regions 306, and a gate electrode 310 is disposed over the gate dielectric 308.

An interlayer dielectric (ILD) layer 312 is disposed over the MOSFET 302 and the semiconductor substrate 304. The ILD layer 312 comprises one or more ILD materials. In some embodiments, the ILD layer 312 may comprise one or more of a low-k dielectric layer (e.g., a dielectric with a dielectric constant less than about 3.9), an ultra-low-k dielectric layer, or an oxide (e.g., silicon oxide). Conductive contacts 314 are arranged within the ILD layer 312. The conductive contacts 314 extend through the ILD layer 312 to the gate electrode 310 and the pair of source/drain regions 306. In various embodiments, the conductive contacts 314 may comprise, for example, copper, tungsten, or some other conductive material.

An interconnect structure 316 is disposed over the ILD layer 312. The interconnect structure 316 comprises a plurality of inter-metal dielectric (IMD) layers 318. A plurality of conductive wires 320 and a plurality of conductive vias 322 are disposed within the IMD layers 318. The conductive wires 320 and conductive vias 322 are configured to provide electrical connections between various devices disposed throughout the IC 300. In some embodiments, the IMD layer 318 may comprise a low-k dielectric layer, an ultra-low-k dielectric layer, or an oxide. In various embodiments, the conductive wires 320 and conductive vias 322 may comprise, for example, copper, aluminum, or some other conductive material In various embodiments, the memory device 100 is disposed within the interconnect structure 316. In some embodiments, the memory device 100 is disposed within one of the IMD layers 318. In further embodiments, the memory device 100 may be disposed within multiple IMD layers 318. In such an embodiment, the memory device 100 may comprise multiple layers each comprising a plurality of one selector-one memory cell (1S1MC) stacks 106.

In some embodiment, each of the first conductive lines 102 are electrically coupled to an individual MOSFET 302 (e.g., to a source/drain region 306 of each MOSFET 302) via conductive wires 320 and conductive vias 322 that are disposed beneath the memory device 100. In various embodiments, a conductive via 322 and a conductive wire 320 disposed over the memory device 100 are coupled to each of the second conductive lines 104. In further embodiments, the conductive vias 322 and the conductive wires 320 that are coupled to the plurality of second conductive lines 104 may be electrically coupled to other individual MOSFETs 302 (not shown) (e.g., to a source/drain region 306 of the other MOSFET 302).

FIGS. 4-14 illustrate a series of cross-sectional views of some embodiments for forming an integrated chip (IC) comprising a memory device having a plurality of semiconductor devices each having a plurality of buffer structures and a plurality of amorphous switching structures.

Figure 4:
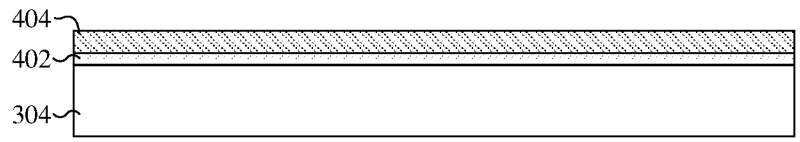
FIGS. 4-14 illustrate a series of cross-sectional views of some embodiments for forming an integrated chip (IC) comprising a memory device having a plurality of semiconductor devices each having a plurality of buffer structures and a plurality of amorphous switching structures.

As illustrated by FIG. 4, a gate dielectric layer 402 and a conductive layer 404 are formed over a semiconductor substrate 304, such that the gate dielectric layer 402 separates the conductive layer 404 from the semiconductor substrate 304. In some embodiments, the gate dielectric layer 402 may be silicon dioxide, a high-k dielectric, or some other dielectric. In further embodiments, the conductive layer 404 may be doped polysilicon, metal, or some other conductor. In yet further embodiments, the semiconductor substrate 304 may comprise any type of semiconductor body (e.g., monocrystalline silicon/CMOS bulk, silicon-germanium (SiGe), silicon on insulator (SOI), etc.).

In some embodiments, a process for forming the gate dielectric layer 402 and the conductive layer 404 comprises depositing or growing the gate dielectric layer 402 on the semiconductor substrate 304, and subsequently depositing or growing the conductive layer 404 on the gate dielectric layer 402. In further embodiments, the gate dielectric layer 402 may be deposited or grown by thermal oxidation, chemical vapor deposition (CVD), physical vapor deposition (PVD), atomic layer deposition (ALD), sputtering, or some other deposition or growth process. In yet further embodiments, the conductive layer 404 may be deposited or grown by CVD, PVD, ALD, sputtering, electrochemical plating, electroless plating, or some other deposition or growth process.

Figure 5:
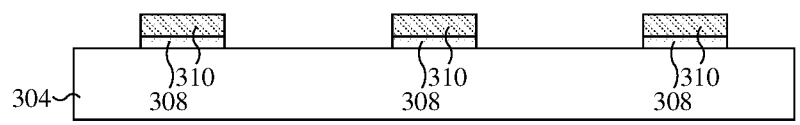

As shown in FIG. 5, the conductive layer 404 and the gate dielectric layer 402 are patterned into a plurality of gate electrodes 310 and a plurality of gate dielectrics 308. In some embodiments, a process for patterning the conductive layer 404 and the gate dielectric layer 402 comprises forming a masking layer (not shown) on the conductive layer 404. In various embodiments, the masking layer may be formed by a spin on process and patterned using photolithography. In further embodiments, the process comprises performing an etch into the conductive layer 404 and the gate dielectric layer 402 with the patterned masking layer in place, and subsequently stripping the patterned masking layer.

Figure 6:
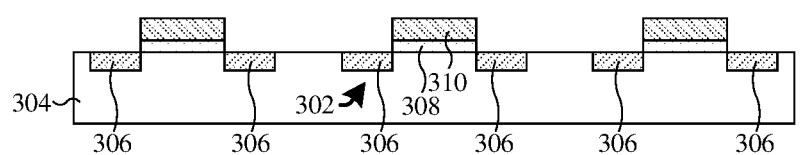

As shown in FIG. 6, pairs of source/drain regions 306 are formed within the semiconductor substrate 304 on opposing sides of the gate electrodes 310. In various embodiments, the pairs of source/drain regions 306 comprise a different doping type than adjoining regions of the semiconductor substrate 304. In some embodiments, the pairs of source/drain regions 306 may be formed by an ion implantation process and may utilize a masking layer (not shown) to selectively implant ions into the semiconductor substrate 304. In further embodiments, forming the pairs of source/drain regions 306 may be a self-aligned process that utilizes the gate electrodes 310 as a masking layer.

Figure 7:
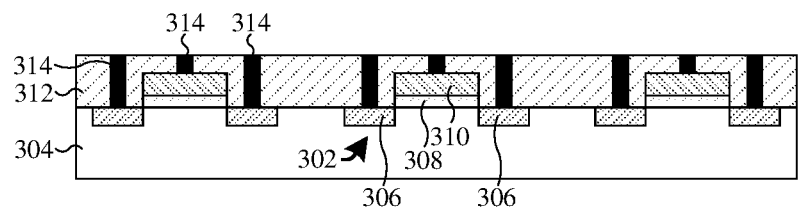

As shown in FIG. 7, an interlayer dielectric (ILD) layer 312 is formed over the semiconductor substrate 304. In some embodiments, the ILD layer 312 may be formed by CVD, PVD, ALD, or some other deposition or growth process. In further embodiments, a planarization process (e.g., a chemical-mechanical planarization (CMP)) may be performed on the ILD layer 312 to form a substantially planar upper surface.

Also shown in FIG. 7, conductive contacts 314 are formed extending through the ILD layer 312 to the source/drain regions 306 and the gate electrodes 310. In some embodiments, a process for forming the conductive contacts 314 comprises performing an etch into the ILD layer 312 to form contact openings that correspond to the conductive contacts 314. In some embodiments, the etch may be performed with a patterned masking layer formed over the ILD layer 312. In further embodiments, the process comprises filling the contact openings with a conductive material. In yet further embodiments, the contact openings may be filled by depositing or growing a conductive layer covering the ILD layer 312 that fills the contact openings, and subsequently performing a planarization (e.g., CMP) on the ILD layer 312. In various embodiments, the process may be part of a single damascene like process or a dual damascene like process.

Figure 8:
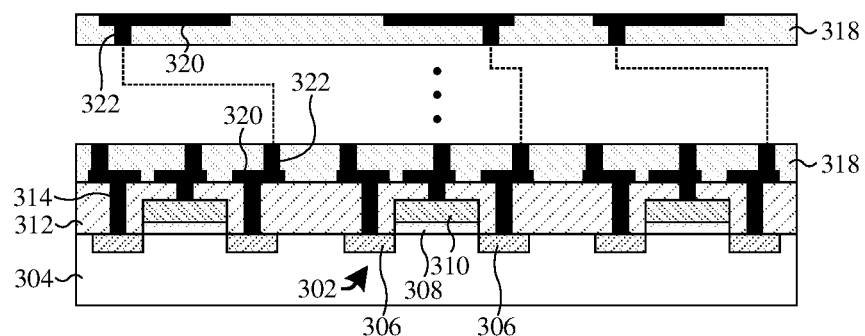

As shown in FIG. 8, a lower group of IMD layers 318 are formed over the ILD layer 312. In some embodiments, an individual IMD layer 318 may be formed by CVD, PVD, ALD, or some other deposition or growth process. In further embodiments, a planarization process (e.g., CMP) may be performed on the individual IMD layer 318 to form substantially planar upper surfaces. This process may be repeated multiple time to form each IMD layer 318 of the lower group of IMD layers 318.

Also shown in FIG. 8, a plurality of conductive wires 320 and a plurality of conductive vias 322 are formed within the IMD layers 318. In some embodiments, a process for forming the conductive wires 320 and the conductive vias 322 in an individual IMD layer 318 comprises performing an etch into the individual IMD layer 318 to form via openings and conductive wire openings that respectively correspond to the conductive vias 322 and the conductive wires 320. In some embodiments, the etch may be performed with a patterned masking layer formed over the individual IMD layer 318. In further embodiments, the process comprises filling the openings with a conductive material. In yet further embodiments, the openings may be filled by depositing or growing a conductive layer covering the individual IMD layer 318 that fills the openings, and subsequently performing a planarization (e.g., CMP) on the individual IMD layer 318. This process may be repeated multiple time to form the plurality of conductive wires 320 and plurality of conductive vias 322 in each of the IMD layer 318 of the lower group of IMD layers 318.

Figure 9:
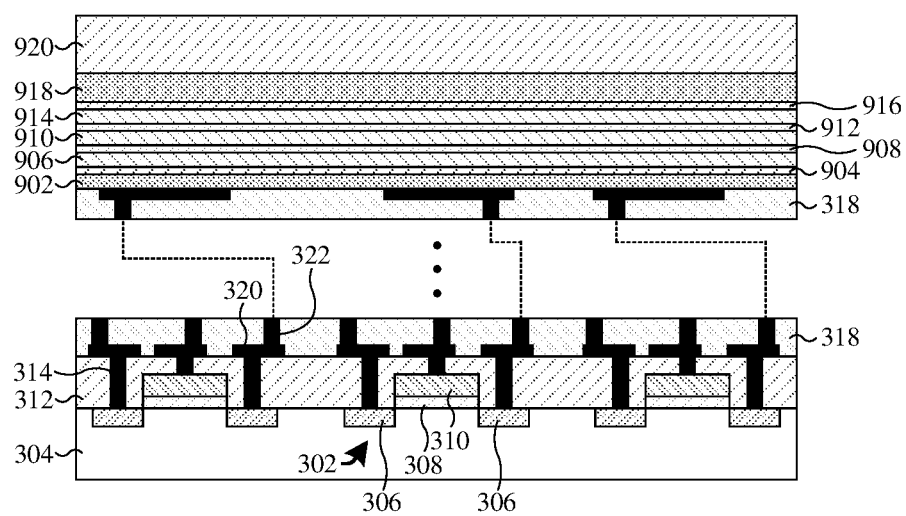

As shown in FIG. 9, a first conductive layer 902 is formed over the lower group of IMD layers 318. A first buffer layer 904 is formed over the first conductive layer 902. A first amorphous switching layer 906 is formed over the first buffer layer 904. A second buffer layer 908 is formed over the first amorphous switching layer 906. A second amorphous switching layer 910 is formed over the second buffer layer 908. A third buffer layer 912 is formed over the second amorphous switching layer 910. A third amorphous switching layer 914 is formed over the third buffer layer 912. A fourth buffer layer 916 is formed over the third amorphous switching layer 914. A second conductive layer 918 is formed over the fourth buffer layer 916. A data storage layer 920 is formed over the second conductive layer 918.

In some embodiments, a process for forming the first conductive layer 902, the first buffer layer 904, the first amorphous switching layer 906, the second buffer layer 908, the second amorphous switching layer 910, the third buffer layer 912, the third amorphous switching layer 914, the fourth buffer layer 916, the second conductive layer 918, and the data storage layer 920 comprises depositing or growing the respective layers over one another by, for example, CVD, PVD, ALD, sputtering, electrochemical plating, electroless plating, or some other deposition or growth process.

In various embodiments, the first conductive layer 902 and the second conductive layer 918 may comprise, for example, copper, aluminum, tungsten, some other suitable conductor, or a combination of the foregoing. In some embodiments, the data storage layer 920 may comprise, for example, a chalcogenide, an oxide, a nitride, a high-k dielectric, or some other suitable dielectric. In further embodiments, the first amorphous switching layer 906, the second amorphous switching layer 910, and the third amorphous switching layer 914 may comprise a chalcogenide. More specifically, the first amorphous switching layer 906, the second amorphous switching layer 910, and the third amorphous switching layer 914 may comprise, for example, tellurium (Te), selenium (Se), sulfur (S), polonium (Po), in combination with, for example, germanium (Ge), silicon (Si), gallium (Ga), indium (In), phosphorus (P), boron (B), carbon (C), nitrogen (N), oxygen (O), etc. In yet further embodiments, the first buffer layer 904, the second buffer layer 908, the third buffer layer 912, and the fourth buffer layer 916 may not comprise a chalcogenide. More specifically, the first buffer layer 904, the second buffer layer 908, the third buffer layer 912, and the fourth buffer layer 916 may comprise, for example, amorphous silicon (a-Si), amorphous germanium (a-Ge), amorphous silicon germanium (a-SiGe), an amorphous carbon nitride compound (a-CNx), amorphous carbon (a-C), boron-doped carbon, a silicon oxide compound (SiOx), an aluminum oxide compound (AlOx).

Figure 10:
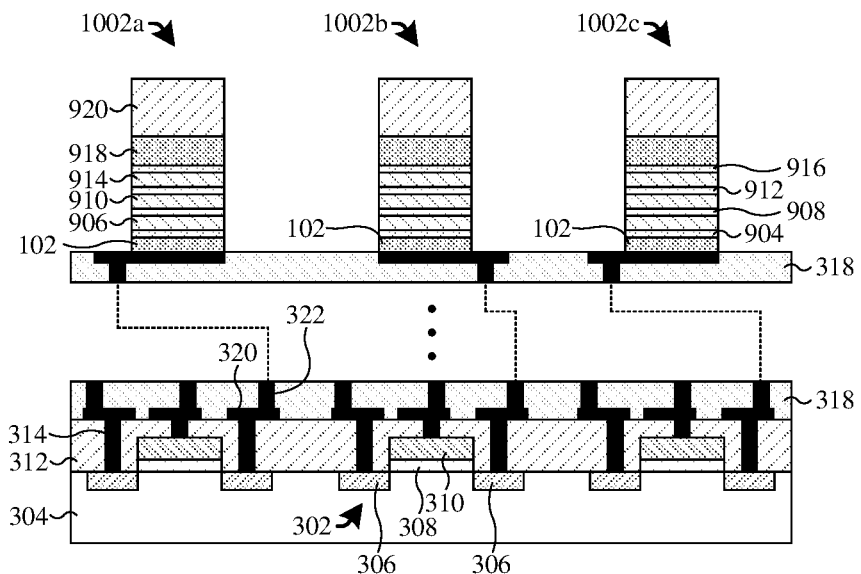

As shown in FIG. 10, a plurality of patterned line structures 1002a-c are respectively formed over a plurality of first conductive lines 102. While not visible within the cross-sectional view of FIG. 10, the patterned line structures 1002a-c are elongated/line shaped along axes extending into and out of the page. The first conductive lines 102 respectively separate the patterned line structures 1002a-1002c from the lower group of IMD layers 318. In various embodiments, the first conductive lines 102 and the patterned line structures 1002a-c extend continuously in a first direction. In some embodiments, the first conductive lines 102 and the patterned line structures 1002a-c respectively extend in substantially straight lines parallel to one another in the first direction.

In some embodiments, a process for forming the patterned line structures 1002a-c and the first conductive lines 102 comprises forming a masking layer (not shown) on the data storage layer 920. In further embodiments, the process comprises performing an etch into the data storage layer 920, the second conductive layer 918, the fourth buffer layer 916, the third amorphous switching layer 914, the third buffer layer 912, the second amorphous switching layer 910, the second buffer layer 908, the first amorphous switching layer 906, the first buffer layer 904, and the first conductive layer 902 with the patterned masking layer in place, and subsequently stripping the patterned masking layer. In further embodiments, a single etch is performed to form the patterned line structures 1002a-c and the first conductive lines 102. In other embodiments, multiples etches are performed to form the patterned line structures 1002a-c and the first conductive lines 102.

Figure 11:
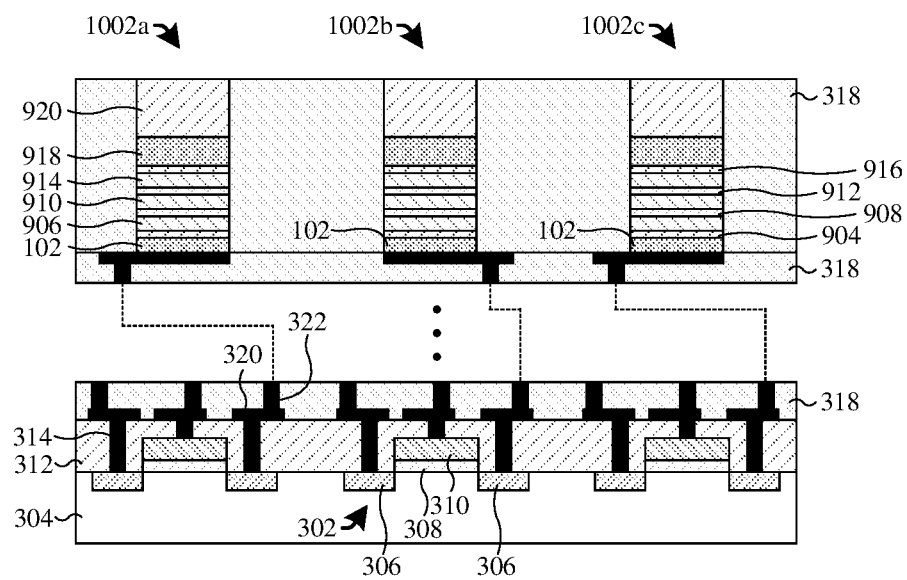

As shown in FIG. 11, an intermediate IMD layer 318 is formed over the patterned line structures 1002a-c and the lower group of IMD layers 318. In some embodiments, the intermediate IMD layer 318 may be formed by CVD, PVD, sputtering, or some other deposition or growth process. In further embodiments, planarization processes (e.g., CMP) may be performed on the intermediate IMD layer 318 to form substantially planar upper surfaces.

Figure 12:
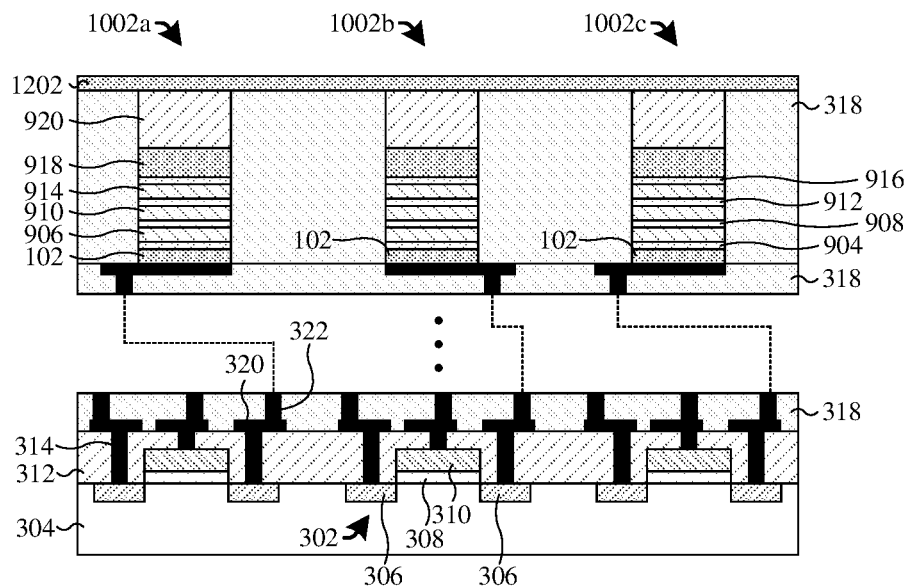

As shown in FIG. 12, a third conductive layer 1202 is formed over the patterned line structures 1002a-c and the intermediate IMD layer 318. In some embodiments, a process for forming the third conductive layer 1202 may comprise depositing the third conductive layer 1202 by, for example, CVD, PVD, ALD, sputtering, electrochemical plating, electroless plating, or some other deposition or growth process. In various embodiments, the third conductive layer may comprise, for example, copper, aluminum, tungsten, some other suitable conductor, or a combination of the foregoing.

Figure 13:
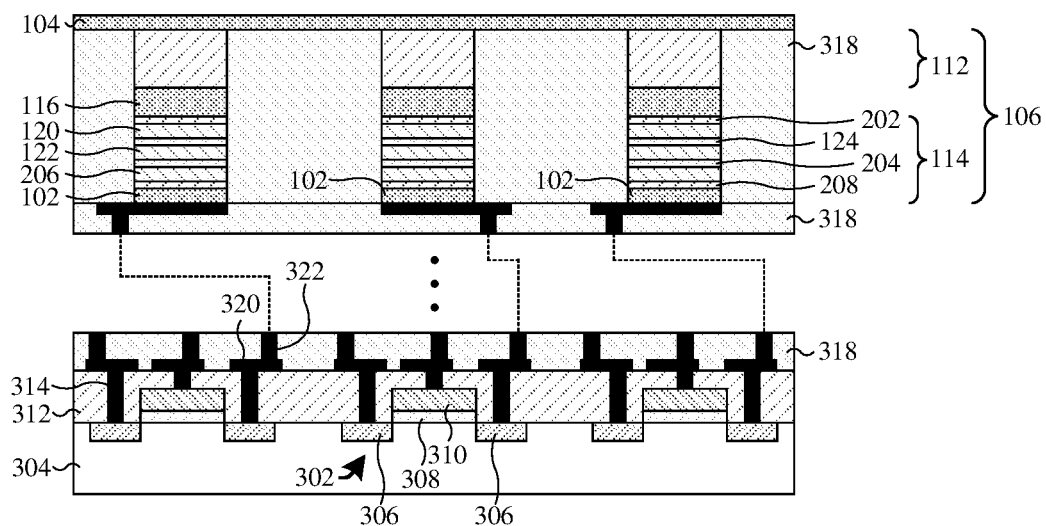

As shown in FIG. 13, a plurality of second conductive lines 104 are formed over a plurality of one selector-one memory cell (1S1MC) stacks 106. Note that only one of the second conductive lines 104 is visible within the cross-sectional view of FIG. 13. In various embodiments, the second conductive lines 104 respectively extend in a second direction transverse the first direction. In some embodiments, the 1S1MC stacks 106 are formed as discrete structures that are arranged in a plurality of rows and columns. In further embodiments, the 1S1MC stacks 106 respectively extend between the second conductive lines 104 and the first conductive lines 102 at a plurality of points in which the second conductive lines 104 and the first conductive lines 102 overlap one another in a vertical direction.

In some embodiments, a process for forming the 1S1MC stacks 106 and the second conductive lines 104 comprises forming a masking layer (not shown) on the third conductive layer 1202. In further embodiments, the process comprises performing an etch into the third conductive layer 1202, the patterned line structures 1002a-c, and the intermediate IMD layer 318 with the patterned masking layer in place, and subsequently stripping the patterned masking layer. In further embodiments, a single etch is performed to form the 1S1MC stacks 106 and second conductive lines 104. In other embodiments, multiple etches are performed to form the 1S1MC stacks 106 and the second conductive lines 104.

Figure 14:
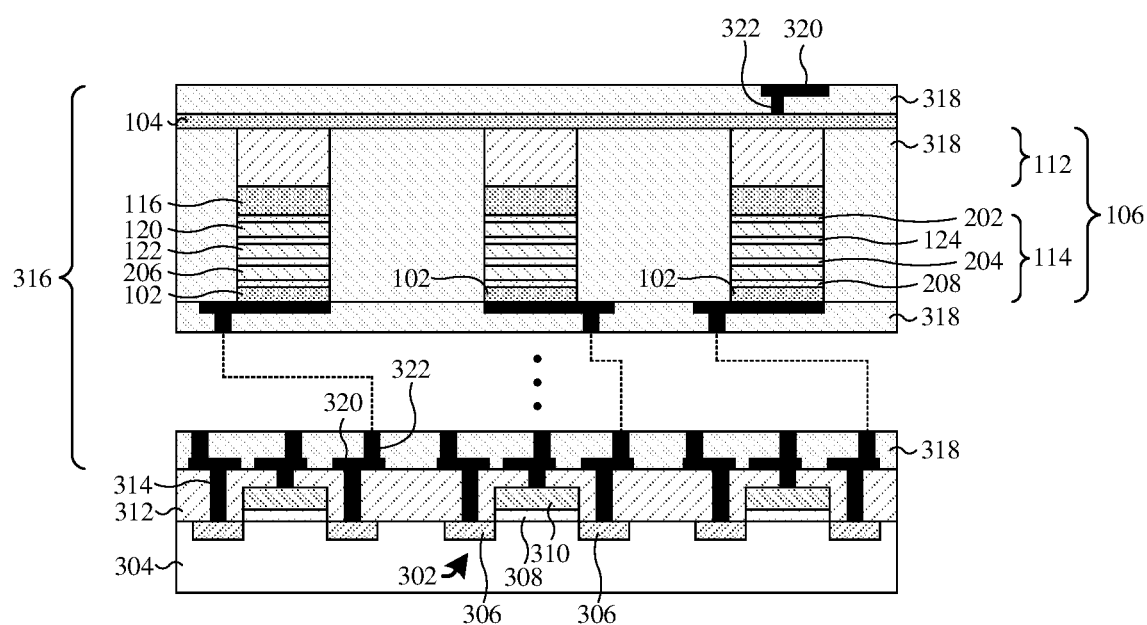

As shown in FIG. 14, an upper IMD layer 318 is formed over the 1S1MC stacks 106 and the second conductive lines 104. In some embodiments, the upper IMD layer 318 is part of an upper group of IMD layers 318 comprising a plurality of IMD layers 318. In some embodiments, the upper IMD layer 318 may be formed by CVD, PVD, ALD, or some other deposition or growth process. In further embodiments, a planarization process (e.g., CMP) may be performed on the upper IMD layer 318 to form substantially planar upper surfaces. In further embodiments, formation of the upper IMD layer 318 fills openings between the 1S1MC stacks 106 formed during formation of the second conductive lines 104 and 1S1MC stacks 106, such that the 1S1MC stacks 106 are separated from one another by an IMD layer 318.

Also shown in FIG. 14, a plurality of conductive wires 320 and a plurality of conductive vias 322 are formed within the upper IMD layer 318. In some embodiments, a process for forming the conductive wires 320 and the conductive vias 322 in the upper IMD layer 318 comprises performing an etch into the upper IMD layer 318 to form via openings and conductive wire openings that respectively correspond to the conductive vias 322 and the conductive wires 320. In some embodiments, the etch may be performed with a patterned masking layer formed over the upper IMD layer 318. In further embodiments, the process comprises filling the openings with a conductive material. In yet further embodiments, the openings may be filled by depositing or growing a conductive layer covering the upper IMD layer 318 that fills the openings, and subsequently performing a planarization (e.g., CMP) on the upper IMD layer 318.

The upper IMD layer 318 is formed with a fabrication temperature that is less than the crystallization temperature of the amorphous switching structures (e.g., the crystallization temperature of the first amorphous switching structure 120, the second amorphous switching structure 122, and/or the third amorphous switching structure 206). If the crystallization temperatures of the amorphous switching structures were less than the fabrication temperature, the amorphous switching structures may crystallize, and thus have a low resistance state. Because the buffer structures (e.g., the first buffer structure 124, the second buffer structure 202, the third buffer structure 204, and/or the fourth buffer structure 208) reduce the individual thicknesses of the amorphous switching structures, the crystallization temperatures of the amorphous switching structures may be greater than the fabrication temperature. By utilizing amorphous switching structures and buffer structures in the threshold selector 114, a combined thickness of the amorphous switching structures is sufficient to minimize leakage current through the threshold selector 114 without reducing the crystallization temperatures of the amorphous switching structures below the fabrication temperature.

Figure 15:
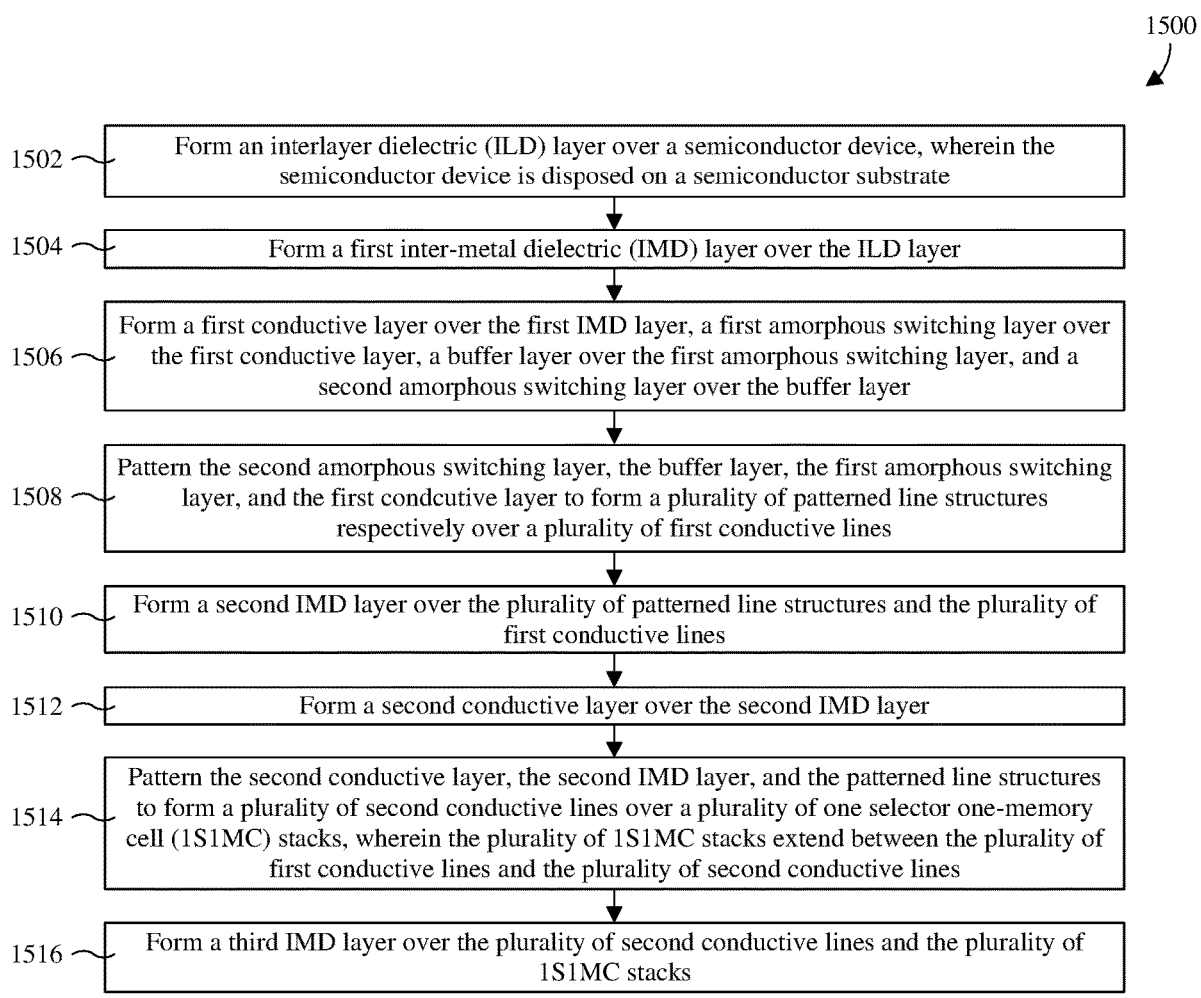
FIG. 15 illustrates a flowchart of some embodiments of a method for forming an integrated chip (IC) comprising a memory device having a plurality of semiconductor devices each having a plurality of buffer structures and a plurality of amorphous switching structures.

As illustrated in FIG. 15, a flowchart 1500 of some embodiments of a method for forming an integrated chip (IC) comprising a memory device having a plurality of semiconductor devices each having a plurality of buffer structures and a plurality of amorphous switching structures is provided. While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1502, an interlayer dielectric (ILD) layer is formed over a semiconductor device, where the semiconductor device is disposed on a semiconductor substrate. FIGS. 4-7 illustrate cross-sectional views of some embodiments corresponding to act 1502.

At 1504, a first inter-metal dielectric (IMD) layer is formed over the ILD layer. FIG. 8 illustrates a cross-sectional view of some embodiments corresponding to act 1504.

At 1506, a first conductive layer is formed over the first IMD layer, a first amorphous switching layer is formed over the first conductive layer, a buffer layer is formed over the first amorphous switching layer, and a second amorphous switching layer is formed over the buffer layer. FIG. 9 illustrates a cross-sectional view of some embodiments corresponding to act 1506.

At 1508, the second amorphous switching layer, the buffer layer, the first amorphous switching layer, and the first conductive layer are patterned to form a plurality of patterned line structures respectively over a plurality of first conductive lines. FIG. 10 illustrates a cross-sectional view of some embodiments corresponding to act 1508.

At 1510, a second IMD layer is formed over the plurality of patterned line structures and the plurality of first conductive lines. FIG. 11 illustrates a cross-sectional view of some embodiments corresponding to act 1510.

At 1512, a second conductive layer is formed over the second IMD layer. FIG. 12 illustrates a cross-sectional view of some embodiments corresponding to act 1512.

At 1514, the second conductive layer, the second IMD layer, and the patterned line structures are patterned to form a plurality of second conductive lines over a plurality of one selector-one memory cell (1S1MC) stacks, where the plurality of 1S1MC stacks extend between the plurality of first conductive lines and the plurality of second conductive lines. FIG. 13 illustrates a cross-sectional view of some embodiments corresponding to act 1514.

At 1516, a third IMD layer is formed over the plurality of second conductive lines and the plurality of 1S1MC stacks. FIG. 14 illustrates a cross-sectional view of some embodiments corresponding to act 1516.

In some embodiments, the present application provides a semiconductor device. The semiconductor device includes a first amorphous switching layer disposed over a first electrode. A first buffer structure is disposed over the first amorphous switching structure. A second amorphous switching structure is disposed over the first buffer structure. A second electrode is disposed over the second amorphous switching structure, where the first and second amorphous switching structures are configured to switch between low resistance states and high resistance states depending on whether a voltage from the first electrode to the second electrode exceeds a threshold voltage.

In other embodiments, the present application provides an integrated chip (IC). The IC includes a semiconductor device disposed on a semiconductor substrate. An interlayer dielectric (ILD) layer is disposed over the semiconductor substrate and the semiconductor device, where a contact via extends through the ILD layer to the semiconductor device. A threshold selector and a memory cell are stacked over the ILD layer, where the threshold selector includes a first amorphous switching structure separated from a second amorphous switching structure by a buffer structure.

In yet other embodiments, the present application provides a method for forming a semiconductor device. The method includes forming an interlayer dielectric (ILD) layer over a semiconductor substrate. A first conductive layer is formed over the ILD layer. A first amorphous switching layer is formed over the first conductive layer. A buffer layer is formed over the first amorphous switching layer. A second amorphous switching layer is formed over the buffer layer. The first amorphous switching layer, the second amorphous switching layer, and the buffer layer are etched to form a plurality of threshold selectors, where the plurality of threshold selectors are disposed in an array and each threshold selector of the plurality of threshold selectors comprises a first amorphous switching structure separated from a second amorphous switching structure by a buffer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a selector-memory cell stack disposed between a first conductive line and a second conductive line, wherein the selector-memory cell stack comprises:
a memory cell electrically coupled to and disposed between the second conductive line and an electrode; and
a threshold selector electrically coupled to and disposed between the first conductive line and the electrode, wherein the threshold selector comprises a plurality of amorphous switching structures and a plurality of buffer structures, wherein the buffer structures and the amorphous switching structures are alternatingly stacked between the electrode and the first conductive line, wherein there are more of the buffer structures than the amorphous switching structures disposed between the electrode and the first conductive line, and wherein the buffer structures are amorphous solids.

2. The integrated chip of claim 1, wherein the amorphous switching structures have a crystallization temperature that is greater than about 400° C.

3. The integrated chip of claim 2, wherein the amorphous switching structures comprise chalcogenides.

4. The integrated chip of claim 1, wherein each of the buffer structures and each of the amorphous switching structures are spaced from the memory cell.

5. The integrated chip of claim 1, wherein each of the buffer structures and each of the amorphous switching structures are disposed on a same side of the electrode.

6. The integrated chip of claim 1, wherein:
the plurality of buffer structures comprise at least three individual buffer structures;
at least one of the individual buffer structures comprises a first amorphous solid material; and
at least two of the individual buffer structures comprise a second amorphous solid material different than the first amorphous solid material.

7. The integrated chip of claim 6, wherein:
a first one of the at least two individual buffer structures comprising the second amorphous solid material is disposed nearer the electrode than each of the amorphous switching structures.

8. The integrated chip of claim 1, wherein a first buffer structure of the plurality of buffer structures directly contacts the electrode.

9. The integrated chip of claim 8, wherein:
the first buffer structure has a first chemical composition; and
the electrode has a second chemical composition different than the first chemical composition.

10. The integrated chip of claim 9, wherein the memory cell directly contacts the electrode.

11. The integrated chip of claim 1, further comprising:
a semiconductor substrate; and
a plurality of dielectric layers disposed over the semiconductor substrate, wherein the selector-memory cell stack is disposed within one of the dielectric layers, and wherein the one of the dielectric layers is spaced from the semiconductor substrate.

12. An integrated chip, comprising:
a selector device electrically coupled to a memory cell, wherein the selector device comprises:
a plurality of amorphous switching structures disposed between a first electrode and a second electrode, wherein the amorphous switching structures are chalcogenides, and wherein the amorphous switching structures are configured to switch between low resistance states and high resistance states based on a voltage between the first electrode and the second electrode; and
a plurality of buffer structures disposed between the first electrode and the second electrode, wherein the buffer structures and the amorphous switching structures are alternatingly stacked between the first electrode and the second electrode, and wherein there are more of the buffer structures than the amorphous switching structures disposed between the first electrode and the second electrode.

13. The integrated chip of claim 12, wherein:
the amorphous switching structures crystallize at a crystallization temperature that is greater than about 400° C.

14. The integrated chip of claim 12, wherein the buffer structures are amorphous solids.

15. The integrated chip of claim 12, wherein:
each of the buffer structures and each of the amorphous switching structures are disposed on a first side of the first electrode; and
the memory cell is disposed on a second side of the first electrode opposite the first side of the first electrode.

16. The integrated chip of claim 15, wherein:
a first buffer structure of the plurality of buffer structures is disposed directly between the first electrode and a first amorphous switching structure of the plurality of amorphous switching structures.

17. The integrated chip of claim 16, wherein:
the first buffer structure has a first chemical composition; and
the first electrode has a second chemical composition different than the first chemical composition.

18. A method for forming a semiconductor device, the method comprising:
forming a first conductive layer over a semiconductor substrate;
forming a first amorphous switching layer over the first conductive layer;

forming a buffer layer over the first amorphous switching layer;

forming a second amorphous switching layer over the buffer layer;

etching the first conductive layer, the first amorphous switching layer, the buffer layer, and the second amorphous switching layer to form a first conductive line, a first amorphous switching structure, a buffer structure, and a second amorphous switching structure, respectively;

forming a dielectric layer over the semiconductor substrate and laterally surrounding the first amorphous switching structure, the buffer structure, and the second amorphous switching structure; and forming a conductive wire over the second amorphous switching structure and the dielectric layer, wherein forming the conductive wire comprises heating the semiconductor substrate to a fabrication temperature greater than about 400° C., and wherein the first amorphous switching structure and the second amorphous switching structure remain amorphous solids above the fabrication temperature.

19. The method of claim 18, further comprising:
before the conductive wire is formed, forming a second conductive layer over the dielectric layer and the second amorphous switching structure; and before the conductive wire is formed, etching the second conductive layer to form a second conductive line that is electrically coupled to the second amorphous switching structure, wherein the conductive wire is formed over the second conductive layer.

20. The method of claim 18, wherein the first conductive layer is etched to form the first conductive line after the second amorphous switching structure is formed over the buffer layer.

* * * * *